United States Patent
Yu et al.

(10) Patent No.: US 9,980,409 B2
(45) Date of Patent: May 22, 2018

(54) MOUNTING DEVICE FOR FAN AND FAN ASSEMBLY

(71) Applicant: ScienBiziP Consulting (Shen Zhen)Co.,Ltd., Shenzhen (CN)

(72) Inventors: Xiang Yu, Shenzhen (CN); Xiao-Yong Ma, Shenzhen (CN)

(73) Assignee: ScienBiziP Consulting(Shenzhen)Co., Ltd., Shenzhen (CN)

( * ) Notice: Subject to any disclaimer, the term of this patent is extended or adjusted under 35 U.S.C. 154(b) by 784 days.

(21) Appl. No.: 14/525,489

(22) Filed: Oct. 28, 2014

(65) Prior Publication Data

US 2015/0245538 A1    Aug. 27, 2015

(30) Foreign Application Priority Data

Feb. 25, 2014   (CN) .......................... 2014 1 0063789

(51) Int. Cl.
  *H05K 5/00*   (2006.01)
  *H05K 7/20*   (2006.01)

(52) U.S. Cl.
  CPC ..... *H05K 7/20172* (2013.01); *H05K 7/20581* (2013.01); *H05K 7/20718* (2013.01)

(58) Field of Classification Search
  CPC ........... H05K 7/20172; H05K 7/20581; H05K 7/20718
  See application file for complete search history.

(56) References Cited

U.S. PATENT DOCUMENTS

| | | | | |
|---|---|---|---|---|
| 6,031,719 A * | 2/2000 | Schmitt | ............ | H05K 7/20172 165/80.3 |
| 6,236,564 B1 * | 5/2001 | Fan | ........................ | F04D 25/12 165/80.3 |
| 6,244,953 B1 * | 6/2001 | Dugan | ............... | H05K 7/20172 361/695 |
| 6,270,046 B1 * | 8/2001 | Liu | ........................ | G06F 1/188 248/231.9 |
| 6,826,048 B1 * | 11/2004 | Dean | ..................... | F04D 29/601 165/122 |
| 6,839,233 B2 * | 1/2005 | Cravens | ............. | H05K 7/20727 361/695 |
| 7,002,796 B2 * | 2/2006 | Lao | ........................ | G06F 1/184 165/121 |
| 7,245,488 B2 * | 7/2007 | Chen | ..................... | F04D 29/601 361/695 |
| 7,349,211 B2 * | 3/2008 | Chen | ................... | H05K 7/20172 361/695 |

(Continued)

*Primary Examiner* — Steven B McAllister
*Assistant Examiner* — Jonathan Cotov
(74) *Attorney, Agent, or Firm* — ScienBiziP, P.C.

(57) ABSTRACT

A mounting device includes an enclosure, a mounting frame, and a pivoting member. The enclosure includes a mounting wall with a hook extending therefrom. The mounting frame is configured for receiving a plurality of fans. The pivoting member is pivotably mounted to the mounting wall. The pivoting member is pivotable relative to the mounting wall to engage in or disengage from the hook. When the pivoting member is engaged in the hook, the pivoting member secures the mounting frame to the mounting wall. When the pivoting member is disengaged from the hook, the mounting frame is removable from the mounting wall. A fan assembly with the mounting device is further disclosed.

17 Claims, 5 Drawing Sheets

(56) References Cited

U.S. PATENT DOCUMENTS

| | | | | |
|---|---|---|---|---|
| 7,385,814 B1* | 6/2008 | Chen | ............ | G06F 1/183 165/122 |
| 7,481,704 B2* | 1/2009 | Kao | ............ | F04D 25/0613 361/695 |
| 7,522,415 B2* | 4/2009 | Fan | ............ | F04D 29/601 312/236 |
| 7,611,328 B2* | 11/2009 | Peng | ............ | H05K 7/20727 415/109 |
| 7,699,692 B2* | 4/2010 | Yin | ............ | H05K 7/20172 361/679.48 |
| 8,567,746 B2* | 10/2013 | Li | ............ | G06F 1/183 248/220.22 |
| 2007/0035924 A1* | 2/2007 | Westphall | ............ | G06F 1/20 361/679.48 |
| 2007/0070594 A1* | 3/2007 | Jimenez | ............ | H05K 7/20172 361/679.02 |
| 2008/0019848 A1* | 1/2008 | Chen | ............ | F04D 29/601 417/360 |
| 2008/0204997 A1* | 8/2008 | Ye | ............ | F04D 29/582 361/695 |
| 2009/0057524 A1* | 3/2009 | Chen | ............ | H05K 7/20172 248/638 |
| 2010/0107397 A1* | 5/2010 | Letourneau | ............ | H05K 7/20172 29/453 |
| 2010/0108847 A1* | 5/2010 | Li | ............ | H05K 7/20172 248/309.1 |
| 2010/0232976 A1* | 9/2010 | Li | ............ | G06F 1/20 416/244 R |
| 2012/0113591 A1* | 5/2012 | Chuang | ............ | H05K 7/20172 361/695 |
| 2012/0328449 A1* | 12/2012 | Xia | ............ | F04D 25/0613 416/244 R |
| 2013/0017076 A1* | 1/2013 | Li | ............ | F04D 25/14 415/201 |
| 2013/0109288 A1* | 5/2013 | Tang | ............ | H05K 7/20736 454/184 |

* cited by examiner

MOUNTING DEVICE FOR FAN AND FAN ASSEMBLY

FIELD

The subject matter herein generally relates to a mounting device for fans and a fan assembly with the mounting device.

BACKGROUND

A number of fans are generally used in an electronic device, such as a server, to cool the electronic system. Generally, the fans are secured to a mounting frame by a number of screws, and the mounting frame is secured to an enclosure of the electronic device by other screws.

BRIEF DESCRIPTION OF THE DRAWINGS

Implementations of the present technology will now be described, by way of example only, with reference to the attached figures.

DETAILED DESCRIPTION

Figure 1:
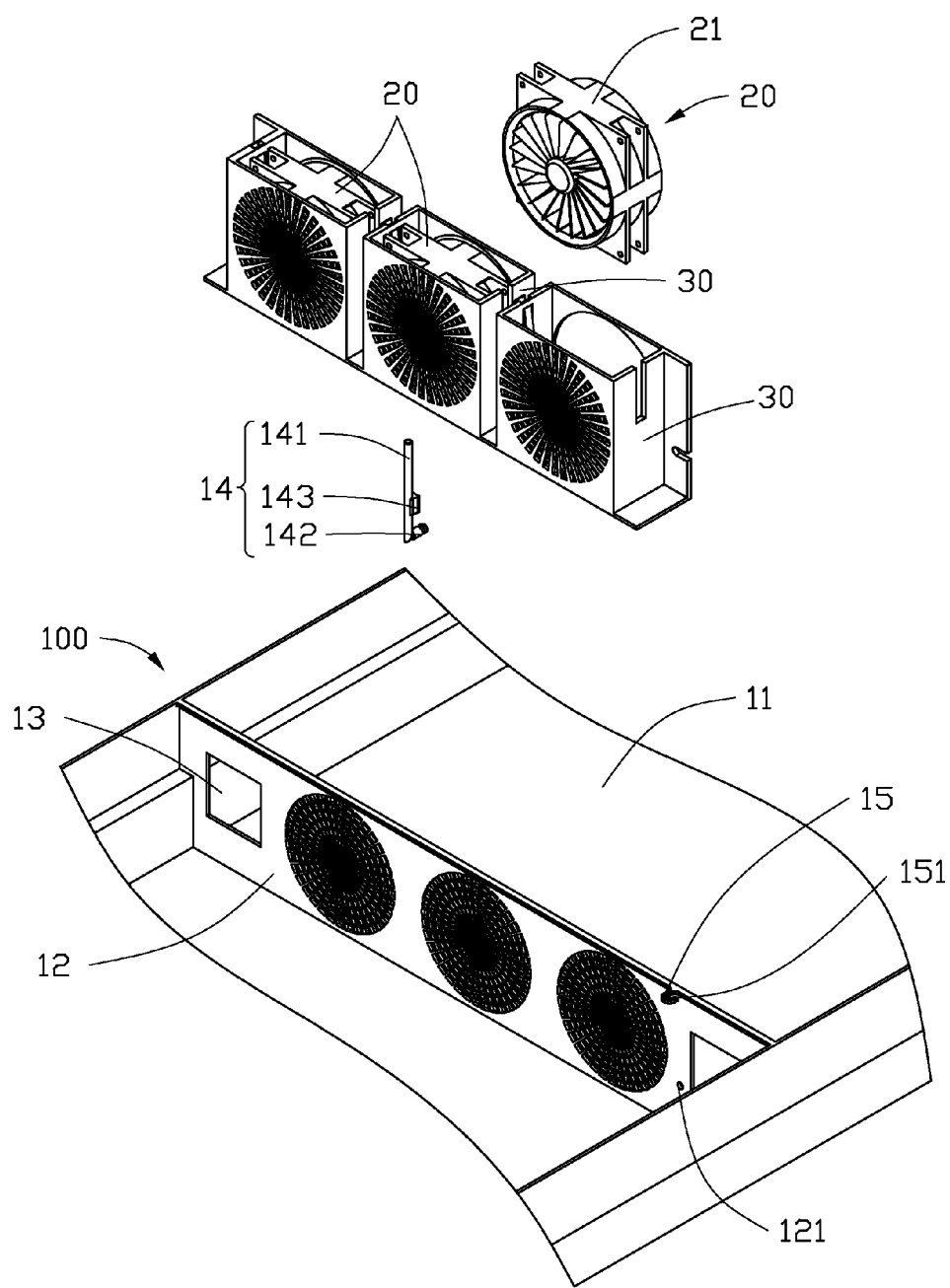
FIG. 1 is an exploded, isometric view of an embodiment of a mounting device and a plurality of fans.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

FIG. 1 illustrates an electronic device in accordance with an embodiment. The electronic device includes a plurality of fans 20 and a mounting device for securing the fans 20. The mounting device can include an enclosure 100 and a mounting frame 30.

The enclosure 100 can include a bottom wall 11, a mounting wall 12 substantially perpendicularly extending from the bottom wall 11, and a pivoting member 14. A first side of the mounting wall 12 defines a latching hole 13. A second side of the mounting wall 12 defines a pivoting hole 121. A hook 15 extends from a top edge of the mounting wall 12 away from the latching hole 13. A hook hole 151 is defined between a distal end of the hook 15 and the mounting wall 12.

The pivoting member 14 can include a latching pole 141, a pivoting portion 142 extending from a bottom end of the latching pole 141, and a resisting portion 143 extending from an outer surface of the latching pole 141. In at least one embodiment, the pivoting portion 142 is substantially perpendicular to the latching pole 141. The pivoting portion 143 is pivotably engaged in the pivoting hole 121. The pivoting member 14 is pivotable relative to the mounting wall 11 to engage the latching pole 141 in or disengaged from the hook 15 through the hook hole 151. In at least one embodiment, the pivoting portion 142 is substantially perpendicular to the mounting wall 12.

The fan 20 can include a case 21 and a recess portion 22 located in an end of the case 21. The recess portion 22 has a resist plat 221.

Figure 2:
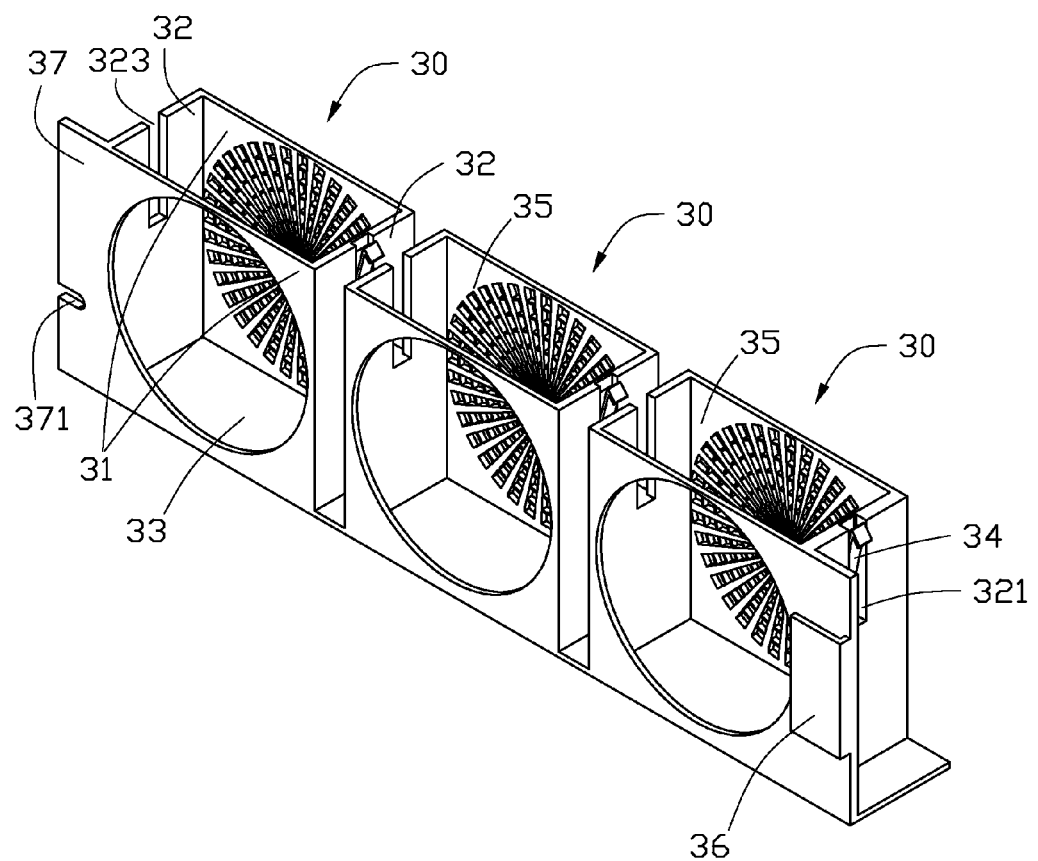
FIG. 2 is an isometric view of a mounting frame of the mounting device of FIG. 1.
Figure 3:
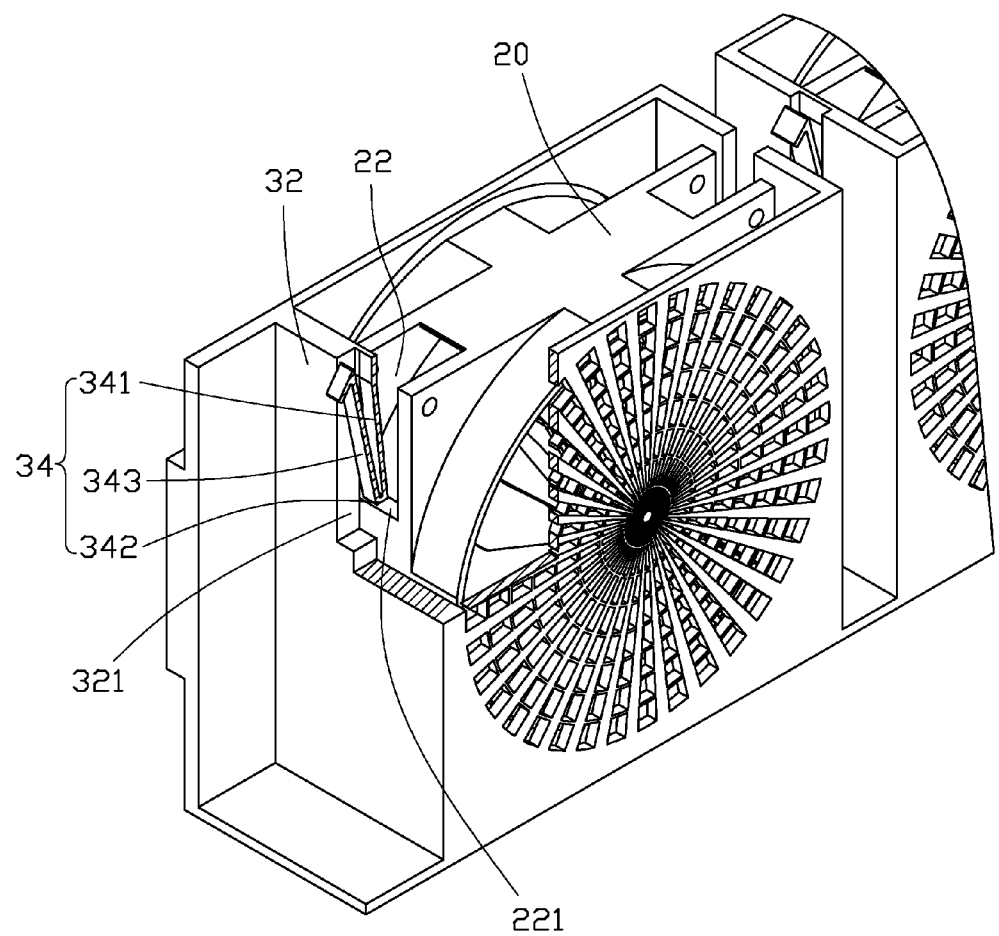
FIG. 3 is a partially assembled, isometric view of a fan assembly with the mounting frame and the plurality of fans of FIG. 1, showing a part of the mounting frame being cut.

FIGS. 2-3 illustrate that the mounting frame 30 can include a pair of first side plates 31, a pair of second side plates 32, and a bottom plate 33. In at least one embedment, each first side plate 31 is substantially perpendicularly coupled to each second side plate 32, and each first plate 31 and second plate 32 is substantially perpendicular to the bottom plate 33. A receiving space 35 is defined cooperatively by the pair of first side plates 31, the pair of second side plate 32, and the bottom plate 33, to receive the fan 20.

The mounting frame 30 further includes a mounting member 34 located on one of the pair of second side plates 32. The mounting member 34 can include a limiting portion 341, a resisting portion 342, and an operation portion 343. The one of the pair of second side plates 32 defines an opening 321. The limiting portion 341 slantingly extends from a top edge of the opening 321 and extends inside of the receiving space 35, where the mounting member 34 is in a first position. The opposite one of the pair of second side plates 32 defines a cutout 323. The limiting portion 341 and the operation portion 343 extend from opposite edges of the resisting portion 342. The limiting portion 341 is elastically deformable relative to the second side plate 32. The operation portion 343 is operable to pull the limiting portion 341 out of the receiving space 35, where the mounting member is in a second position. In at least one embedment, the resist plate 221 is substantially perpendicular to each second side plate 32.

The mounting frame 30 further includes two installation plates 37 extending from opposite side edges of one of the pair of first side plates 31. One of the two installation plates 37 defines a through slot 371 extending in a direction substantially perpendicular to each second side plate 32. A blocking portion 36 extends from another one of the two installation plates 37.

Figure 4:
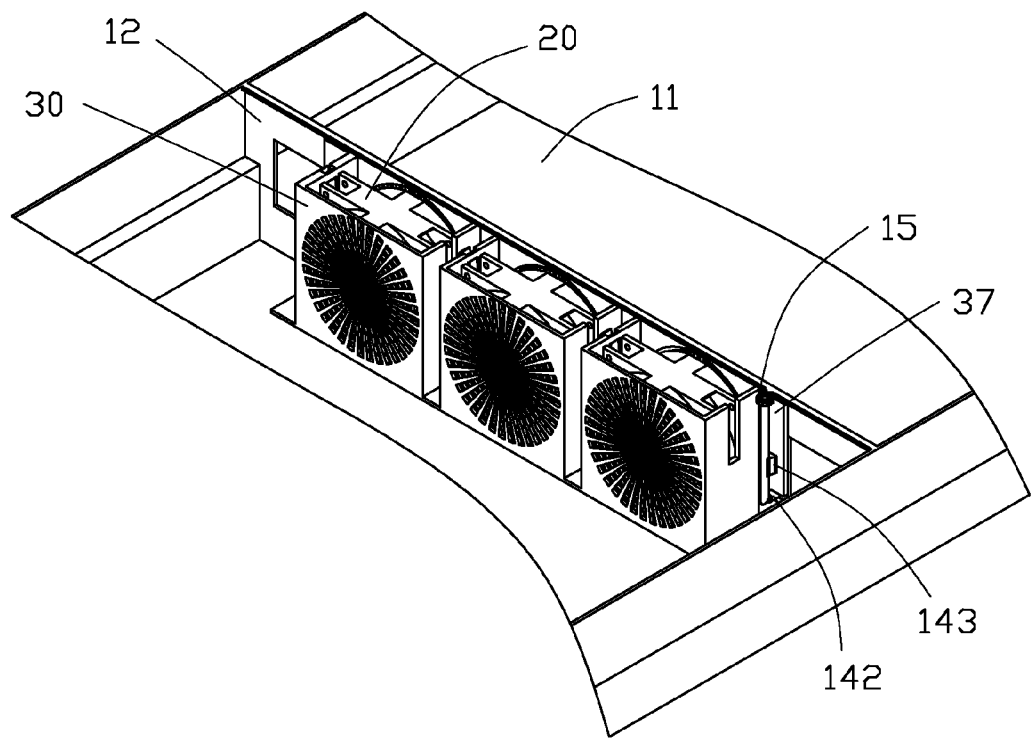
FIG. 4 is an assembled, isometric view of the mounting device and the plurality of fans of FIG. 1.
Figure 5:
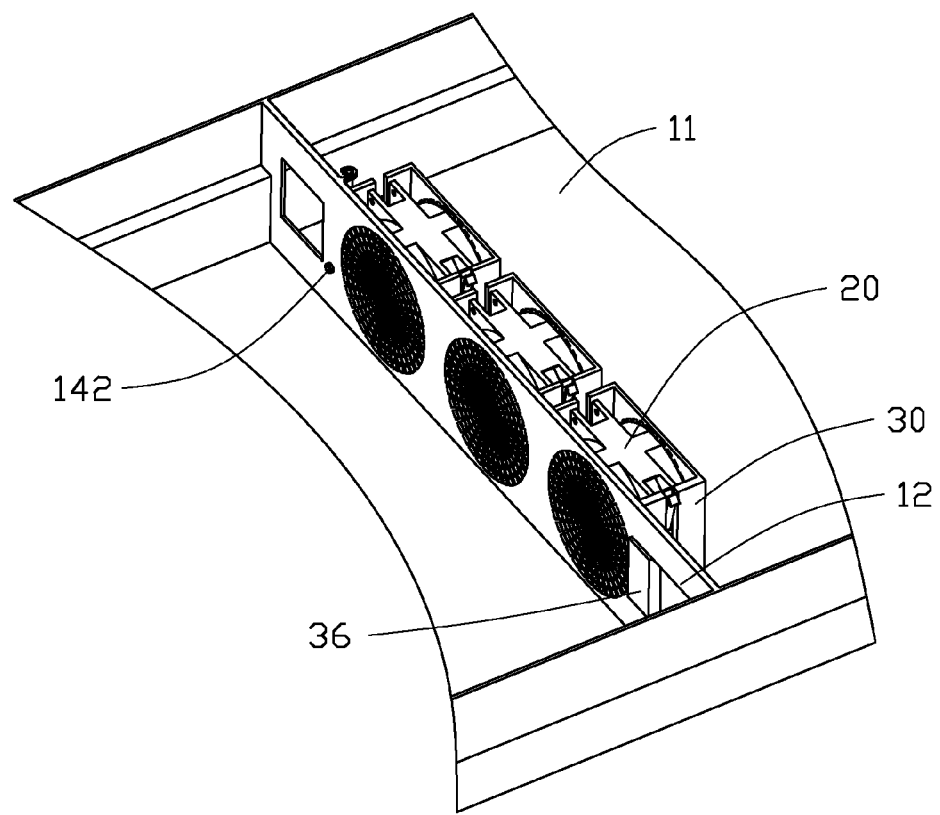
FIG. 5 is similar to FIG. 4, but viewed from a different angle.

FIGS. 4-5 illustrate that in assembly, each fan 20 is moved into the receiving space 35 in a direction substantially perpendicular to the bottom plate 33. The limiting portion 341 is elastically deformed by the fan 20, and the mounting member 34 is pressed from the first position to the second position until the mounting member 34 is aligned to the recess portion 22. The mounting member 34 is moved back to the first position, the limiting portion 341 extends into the recess portion 22, and the resisting portion 342 abuts the resist plat 221. Thus, the fans 20 are secured to the mounting frame 30.

The pivoting member 14 is pivoted away from the latching hole 13 to disengage the latching pole 141 from the hook 15. The mounting frame 30 is moved towards the mounting wall 12 with the blocking portion 36 extending out of the latching hole 13. The mounting frame 30 is moved towards the hook 15 until the blocking portion 36 is blocked by a side edge of the latching hole 13. The mounting wall 12 is latched between the blocking portion 36 and the one of the first side plates 31, and the pivoting portion 142 is received in the through slot 371. The pivoting member 14 is rotated towards the hook 15 to engage the pivoting pole 141 with the hook 15. The resisting portion 143 presses the installation plate 37 between the mounting wall 12 and the resisting portion 143. Thus, the mounting frame 30 is secured to the mounting wall 12.

During disassembly the fan 20 from the mounting frame 30, the operation portion 343 is pulled to move the mounting member 34 to the second position, the fan 20 can be removed from the mounting frame 30.

During disassembly the mounting frame 30 from the enclosure 100, the pivoting member 14 is rotated to disengage the pivoting pole 141 from the hook 15, the resisting portion 143 is disengaged from the installation plate 37, and the mounting frame 30 can be moved away from the hook 15 to be removed from the enclosure 100.

The embodiments shown and described above are only examples. Many details are often found in the art such as the other features of a mounting device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A mounting device comprising:
an enclosure comprising a mounting wall with a hook extending therefrom;
a mounting frame configured to receive a plurality of fans; and
a pivoting member pivotably mounted to the mounting wall;
wherein the pivoting member is pivotable relative to the mounting wall to engage in or disengage from the hook;
the pivoting member is configured such that when the pivoting member is engaged in the hook, the pivoting member secures the mounting frame to the mounting wall, and when the pivoting member is disengaged from the hook, the mounting frame is removable from the mounting wall; and
the enclosure further comprises a bottom wall, and the mounting frame is located between the hook and the bottom wall; the mounting frame comprises a first side plate and two installation plates extending from opposite side edges of the first side plate, and a top edge of one of the two installation plates abuts the hook.

2. The mounting device of claim 1, wherein the one of the two installation plates defines a through slot, when the pivoting member is engaged in the hook, the pivoting member extends through the through slot; and when the pivoting member is disengaged from the hook, the pivoting member is disengaged from the through slot.

3. The mounting device of claim 1, wherein the pivoting member comprises a pivoting portion pivotably mounted to the mounting wall, a pivoting pole, and a resisting portion extending from the pivoting pole, the pivoting pole is configured to engage with the hook, and the resisting portion is configured to resist the one of the two installation plates towards the mounting wall.

4. The mounting device of claim 3, wherein the pivoting portion is substantially perpendicular to the mounting wall, and the pivoting pole is substantially parallel to the mounting wall.

5. The mounting device of claim 1, wherein the mounting wall defines a latching hole, the mounting frame further comprises a blocking portion extending from another of the two installation plates, the blocking portion extends through the latching hole, and the mounting wall is engaged between the blocking portion and the first side plate.

6. The mounting device of claim 1, wherein the mounting frame further comprises two second side plates and a mounting member located on one of the two second side plates, and the mounting member extends into a receiving space which is defined by the mounting frame and configured to receive the plurality of fans.

7. The mounting device of claim 6, wherein the mounting member comprises a limiting portion extending slantingly from the one of the two second side plates, an operation portion operable to elastically deform the limiting portion out of the receiving space, and a resisting portion coupled between the limiting portion and the operation portion; and the resisting portion is configured to resist a resist plate of the plurality of fans.

8. A mounting device comprising:
a mounting frame comprising two first side plates, two second side plates, and a mounting member extending from one of the two second side plates;
wherein the two first side plates and the two second side plates cooperatively define a receiving space configured to receive a plurality of fans; and the mounting member extends into the receiving space and configured to extend in a recess portion of each fan to secure each fan to the mounting frame; and
the mounting member comprises a limiting portion extending slantingly from the one of the two second side plates, an operation portion operable to elastically deform the limiting portion out of the receiving space, and a resisting portion coupled between the limiting portion and the operation portion; and the resisting portion is configured to resist a resist plate of the recess portion.

9. The mounting device of claim 8, wherein further comprising an enclosure and a pivoting member, wherein the enclosure comprises a mounting wall with a hook extending therefrom, and the pivoting member is pivotable relative to the mounting wall to engage in or disengage from the hook; when the pivoting member is engaged in the hook, the pivoting member secures the mounting frame to the mounting wall; and when the pivoting member is disengaged from the hook, the mounting frame is removable from the mounting wall.

10. The mounting device of claim 9, wherein the enclosure further comprises a bottom wall, and the mounting frame is located between the hook and the bottom wall; the mounting frame further comprises two installation plates extending from opposite side edges of one of the two first side plates, and a top edge of one of the two installation plates abuts the hook.

11. The mounting device of claim 10, wherein the one of the two installation plates defines a through slot, when the pivoting member is engaged in the hook, the pivoting member extends through the through slot; and when the pivoting member is disengaged from the hook, the pivoting member is disengaged from the through slot.

12. The mounting device of claim 10, wherein the pivoting member comprises a pivoting portion pivotably mounted to the mounting wall, a pivoting pole, and a resisting portion extending from the pivoting pole, the pivoting pole is configured to engage with the hook, and the resisting portion is configured to resist the one of the two installation plates towards the mounting wall.

13. The mounting device of claim 12, wherein the pivoting portion is substantially perpendicular to the mounting wall, and the pivoting pole is substantially parallel to the mounting wall.

14. The mounting device of claim 10, wherein the mounting wall defines a latching hole, the mounting frame further comprises a blocking portion extending from another of the two installation plates, the blocking portion extends through the latching hole, and the mounting wall is engaged between the blocking portion and the first side plate.

15. The mounting device of claim 8, wherein the mounting frame further comprises two second side plates and a mounting member located on one of the two second side plates, and the mounting member extends into a receiving space which is defined by the mounting frame and configured to receive the plurality of fans.

16. A fan assembly comprising:
a plurality of fans, each fan having a recess portion; and
a mounting frame receiving the plurality of fans and comprising a side plate and a mounting member extending from the side plate;
wherein the mounting member extends into the recess portion, preventing each fan from being removed from the mounting frame; and
the mounting member comprises a limiting portion extending slantingly from the side plate inside the recess portion, an operation portion operable to elastically deform the limiting portion out of the recess portion, and a resisting portion coupled between the limiting portion and the operation portion; and the resisting portion resists a resist plate of the recess portion.

17. The fan assembly of claim 16, further comprising an enclosure and a pivoting member, wherein the enclosure comprises a mounting wall with a hook extending therefrom, and the pivoting member is pivotable relative to the mounting wall to engage in or disengage from the hook; when the pivoting member is engaged in the hook, the pivoting member secures the mounting frame to the mounting wall; and when the pivoting member is disengaged from the hook, the mounting frame is removable from the mounting wall.

* * * * *